United States Patent [19]

Ricard et al.

[11] 4,233,338
[45] Nov. 11, 1980

[54] PROCESSES FOR DEPOSITION OF THIN FILMS OF CRYSTALLINE SILICON ON GRAPHITE

[75] Inventors: Jean Ricard, Grenoble; Charles Excoffon, Vaulnaveys le Bas, both of France

[73] Assignee: Produits Chimiques Ugine Kuhlmann, Paris, France

[21] Appl. No.: 926,879

[22] Filed: Jul. 24, 1978

[30] Foreign Application Priority Data

Aug. 31, 1977 [FR] France .............................. 77 26402

[51] Int. Cl.² .......................................... H01L 21/36
[52] U.S. Cl. ...................................... 427/85; 148/171; 148/172; 156/605; 156/608; 156/622; 427/86
[58] Field of Search .................. 427/86; 156/605, 608, 156/622; 148/172, 171

[56] References Cited

U.S. PATENT DOCUMENTS

| 3,160,521 | 12/1964 | Ziegler et al. | 427/86 |
| 4,077,818 | 3/1978 | Chu | 427/86 |
| 4,090,851 | 5/1978 | Berkman et al. | 156/608 |
| 4,099,924 | 7/1978 | Berkman et al. | 156/608 |
| 4,119,744 | 10/1978 | Brissoh et al. | 427/86 |
| 4,124,411 | 11/1978 | Meuleman et al. | 427/86 |

FOREIGN PATENT DOCUMENTS 2321326 3/1977 France .

OTHER PUBLICATIONS

Belouet C. et al., "Growth of Polycrystalline Silicon Layers on Carbon Substrates for Application as Solar Cells", pp. 191-198, of the Colloquium concerning Solar Energy at Toulouse, France, 1976.

Primary Examiner—John D. Smith
Attorney, Agent, or Firm—Brooks, Haidt, Haffner & Delahunty

[57] ABSTRACT

Processes for the continuous deposition of crystalline silicon on graphite substrates, the silicon being undoped or N- or P-doped and the substrates being useful for photovoltaic cells and other electronic devices, the processes comprising placing crystalline silicon in at least one crucible having a capillary port with a vertical axis in its lower part; bringing the silicon to its melting point; bringing a graphite substrate into contact with the pendant drop formed at the lower mouth of the capillary; moving the substrate at a selected speed in a constant predetermined direction; and removing the substrate coated with the crystalline substance at chosen time intervals.

10 Claims, 3 Drawing Figures

PROCESSES FOR DEPOSITION OF THIN FILMS OF CRYSTALLINE SILICON ON GRAPHITE

BACKGROUND OF THE INVENTION

The present invention relates to methods for depositing crystalline silicon on substrates, and more particularly, it relates to the deposition of undoped or N- or P-doped crystalline silicon in thin films on graphite substrates.

In the electronic industry, there is an increasing need to fabricate devices such as transistors, photovoltaic cells, and microcircuits in which crystalline silicon is deposited in the form of a thin film on the surface of a graphite body, generally denominated a "substrate". Although it has been possible to deposit silicon in thicknesses on the order of 300 microns, up to the present time, there has been no satisfactory method for the deposition of crystalline silicon on graphite in the form of a thin film. Moreover, the prior art deposition methods do not produce a uniform layer.

It is known to deposit certain materials, such as silicon, in the vapor phase on various substrates, such as, for instance, sapphire, spinel, and graphite. These methods for vapor phase deposition do not however permit the production of very thin films, that is, film thicknesses on the order of one to ten microns. Another method, called the diffusion method, involves depositing the crystallizable material on the substrate surface, whereon it then crystallizes. This method also leads to very thin films having thicknesses on the order of one micron. Moreover, in the case of crystalline substances such as silicon, one such method results in a systematic chemical attack on all the substrates.

A recent LEP process, described in the article "Growth of Polycrystalline Silicon Layers on Carbon Substrates for Application as Solar Cells", at pages 191 to 198 of the proceedings of the Colloquium concerning Solar Energy held from Mar. 1 to 5, 1976, at Toulouse, France, relates to the deposition of silicon on a graphite substrate. This method involves immersing the graphite substrate in a silicon bath and pulling the substrate at a selected angle with the horizontal. It is difficult in such a system to obtain a consistent deposition thickness. It is equally difficult to carry out such a method continuously. Moreover, the process requires the maintenance of a considerable quantity of molten silicon in the crucible, and this is very troublesome.

Beyond the foregoing difficulties, none of the prior art methods permits the side-by-side deposition of layers of different substances or different compositions of the same substances. None of these methods, moreover, permits the deposition of a film having a varying composition, continuously or according to a given scheme. It is moreover very difficult, if not impossible, with the methods of the prior art to effect a multiple layer deposit, that is to say, a deposit containing a plurality of layers one on top of the other. Thus, it can be desirable to form deposited films on a graphite substrate, the film comprising bands of silicon alternately doped P and N, or comprising multiple layer films of alternating doped silicon and N-doped silicon, or comprising crystalline silicon films with a continuously variable doping.

THE INVENTION

An object of the present invention is to provide a continuous method for depositing silicon films, having a thickness on the order of ten to 1,000 microns, on graphite substrates. A further object of the invention is to provide a method permitting the deposition on a graphite substrate of a film of silicon having a variable doped composition.

Another object of the invention is the provision of a method permitting the side-by-side deposition on a substrate of differently doped silicon bands or silicon doped with different compositions. Still a further object of the invention is to provide a method which will easily provide multilayer deposition.

The processes of the present invention accordingly provide continuous deposition on substrates of silicon in the form of thin films, the composition, thickness, and crystal orientation being controllable. Briefly, the processes comprise melting silicon in a crucible having in its lower region a capillary conduit with a substantially vertical axis, the length of the capillary below the surface of the molten silicon being at least equal to the retention height of the molten silicon material in the capillary; bringing a graphite substrate into contact with the molten silicon at the bottom of the capillary; moving the substrate at a selected speed in a direction which is at an angle of 0° to about 60° with the horizontal to permit the molten silicon to flow downwardly onto the substrate and form a thin film of silicon on the substrate; and periodically removing the substrate coated with crystalline silicon.

The invention will be further described herein with reference to the accompanying drawings, wherein.

Figure 1:
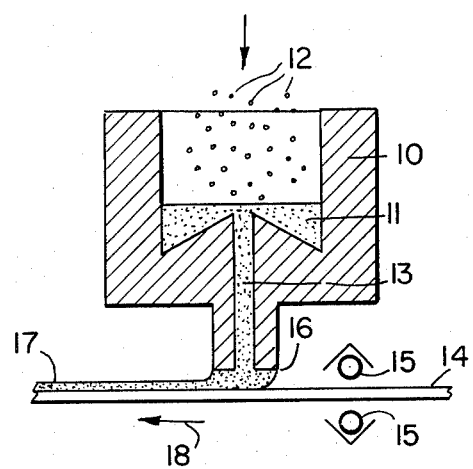
FIG. 1 is a partly sectional view of one deposition apparatus.

One embodiment for the continuous deposition of crystalline silicon in thin layers on a graphite substrate according to the present invention comprises:

(a) Placing the crystalline silicon material in a crucible including in its lower part a capillary channel with a vertical axis and having a height greater than or equal to the retention height in said capillary of the molten material at the desired temperature and pressure;

(b) Bringing the material to a temperature above its melting point;

(c) Bringing the preheated substrate into contact with the pendant drop formed in the lower part of the capillary port;

(d) Moving the substrate at a suitable speed in a constant selected direction, the direction making an angle of from 0° to 60° with the horizontal; and (e) Removing at selected time intervals the substrate coated with crystalline silicon.

To obtain a deposited layer having a variably doped composition, the doping of the silicon material fed to the crucible is varied in a predetermined fashion.

The process according to the present invention for continuous deposition on a substrate of a thin film comprised of side-by-side bands of differently doped silicon or silicon with a different doping composition comprises:

(a) Placing each differently doped silicon material or the silicon doped with different materials in separate crucibles, each fitted in its lower part with a capillary port having a height greater than or equal to the retention height in the capillary of the material contained in the molten state at the selected temperature and pressure, the axes of all the capillary orifices being vertical and having a substantially equal length;

(b) Bringing the material in each crucible to a temperature above its melting point;

(c) Bringing the preheated substrate into contact with the pendant drops formed at the lower edges of the capillary ports;

(d) Advancing the substrate at a selected speed in a selected constant direction meeting in a plane parallel to the axes of the capillary ports; and (e) Removing at selected time intervals the substrate covered with the side-by-side film bands.

The continuous process according to the present invention for depositing a multilayer thin film of silicon on the graphite substrate comprises:

(a) Placing the silicon material which is to comprise the different layers in separate crucibles, each crucible having in its lower part a capillary channel having a height equal to or greater than the retention height of the material in the molten state at the selected temperature and pressure, the axes of all of the capillary orifices being vertical;

(b) Bringing the material in each of the crucibles to its melting point;

(c) Bringing the preheated substrate into contact with the pendant drop formed at the lower edge of the capillary channel of the first crucible to form the first layer;

(d) Moving the coated substrate having the first layer in a predetermined direction making an angle of from 0° to about 60° with the horizontal, and bringing it into contact with a pendant drop formed in the lower edge of a second capillary;

(e) Continuing the operation until the substrate is brought into contact with the pendant drop formed in the lower rim of the last capillary; and (f) Removing the thus coated substrate having multiple superimposed layers.

The length $L_p$ of the $p^1$ capillary is described by the equation:

$$L_p = L_1 - \frac{\sum_{x=1}^{p-1} L_x}{\cos \alpha}$$

wherein $\alpha$ is the angle of displacement of the substrate from the horizontal and $L_1$ is the length of the first capillary.

The apparatus utilized for the deposition of the crystalline material in a thin film on the substrate according to the present invention is, for example, described in French Patent Application No. 75.24770, published under No. 2,321,326. The lower extremity or lip of the capillary can have various appropriate forms, such as those described in the aforementioned Application No. 75.24770. Thus, the lower lips or rim of the capillary channel can be at the same horizontal level or different horizontal levels.

The preheating of the substrate can be carried out by conventional means, desirably by radio-frequency induction.

Optionally, a post-heating of the coated substrate can be used. The post-heating can be effected by the same means as the preheating.

All of the coating operations are carried out in an appropriate atmosphere, for example, under argon or helium free of oxygen.

Optionally, a seed crystal can be placed on the substrate at the point where the deposition is begun in such a fashion that the pendant drop of liquid comes in contact with the seed and thus the crystal layer formed is oriented as in the seed.

The speed of movement of the substrate can vary and in certain embodiments of this invention is desirably from about 1 mm/min to about 100 mm/min.

Figure 2:
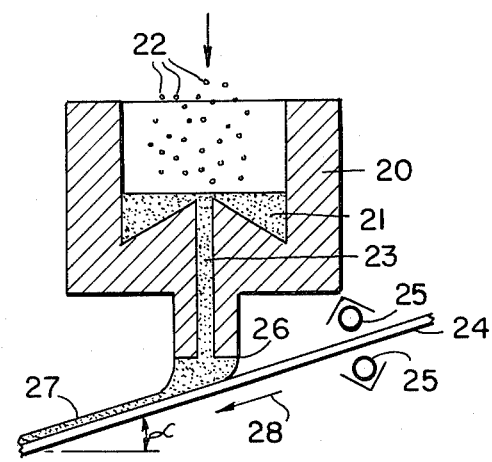
FIG. 2 is a partly sectional view of deposition at an angle.
Figure 3:
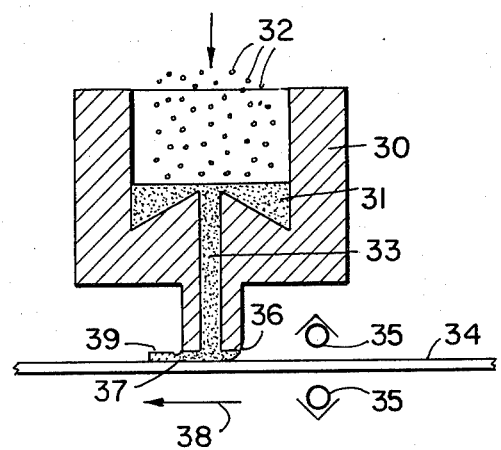
FIG. 3 is a partly sectional view of an embodiment utilizing a seed.

FIG. 1 diagrams the deposition of a silicon crystal film utilizing horizontal displacement of the substrate. FIG. 2 schematically shows the deposition of a film while the substrate is moved in direction 28 at angle $\alpha$ to the horizontal. FIG. 3 schematically shows the deposition of a film on a substrate where the deposition begins with horizontal displacement of the substrate.

In FIG. 1, crucible 10 is charged with silicon 11 which is maintained in the molten state by induction heating coils (not shown). Molten silicon 11 is continuously replenished from a hopper (not shown) with silicon crystals 12 which are melted by the induction heaters and by contact with molten material 11. Crucible 10 is provided with capillary channel 13 which has a length slightly greater than the retention height of the silicon.

Molten silicon contacts graphite substrate 14 which has been preheated by coils 15 to a temperature below the melting point of the silicon. Molten silicon contacts substrate 14 at capillary mouth 16 to form a thin layer 17 of silicon which crystallizes on substrate 14 as the substrate is continuously moved in a fixed direction shown by arrow 18.

In the FIG. 2 embodiment, crucible 20 is charged with molten silicon 21 and continuously replenished by crystals 22. Crucible 20 is fitted with substantially vertical capillary channel 23 with a retention length equal to or greater than the retention height of silicon 21.

Substrate 24, preheated by heater 25, is moved in the direction shown by arrow 28, which is at angle $\alpha$ with the horizontal. The molten silicon leaves capillary mouth 26 to form thin layer 27 as substrate 25 is moved.

FIG. 3 illustrates yet another embodiment of the present invention. Crucible 30 contains molten silicon 31 which is continuously replenished by silicon crystals 32. Crucible 30 is provided with capillary channel 33 having a length greater than the retention height of the molten silicon.

The molten silicon first contacts substrate 34 and seed crystal 39 simultaneously, the seed and substrate having been heated by coils 35 as substrate 34 is advanced in the direction of arrow 38. The molten silicon feeds from lip 36 to form a uniform continuous thin layer 37. Layer 37 has the same crystalline orientation on cooling as did seed crystal 39.

According to the method of the present invention, one can, for example, produce a film comprised of silicon bands alternately doped N and P, or a multilayer film of silicon, the layers alternately doped N and P, or a silicon film having a doping of continuously varying composition.

The graphite substrates coated with crystalline silicon according to the present invention are the principal components of photovoltaic cells.

The following Example is given to illustrate an embodiment of the invention as it is presently preferred to practice it. It will be understood that this Example is illustrative, and the invention is not to be considered as restricted thereto except as indicated in the appended claims.

EXAMPLE

Deposition of Silicon on High-Density Graphite Substrate

A graphite crucible having a 25 mm long channel and a capillary orifice with a base which is 0.7 mm by 24.5 mm is utilized. The length of the graphite substrate to be coated is 25 mm and its thickness is about one millimeter. The temperature of the liquid silicon at the bottom of the pendant drop is 1425° C.±0.5° C.

Silicon powder is fed to the apparatus at the rate of 18 g/hour. After preheating the substrate to 410° C., it is placed 0.3 mm below the channel and contacted with the pendant drop formed at the bottom of the capillary channel. The substrate is then moved horizontally at a speed of one centimeter/minute.

There is obtained a graphite substrate having deposited thereon a silicon film with a thickness of 0.3±0.03 mm.

What is claimed is:

1. A process for providing crystalline silicon coatings on graphite substrates, which process comprises maintaining molten silicon material in a crucible having in its lower region a capillary conduit with a substantially vertical axis, the length of the capillary being at least equal to the retention height of the molten silicon material in the capillary to form a pendant drop at the bottom of the capillary; bringing a graphite substrate into contact with the drop of molten silicon material formed at the bottom of the capillary; moving the substrate at a selected speed in a direction which is at an angle of from 0° to about 60° with the horizontal, whereby molten silicon material flows downwardly through the capillary onto the substrate to form a thin film thereon; and periodically removing the crystalline silicon-coated substrate so formed.

2. A process according to claim 1 wherein the substrate is preheated prior to contact with the silicon.

3. A process according to claim 1 wherein the substrate is heated subsequent to contact with the silicon.

4. A process according to claim 1 wherein the substrate is advanced at a speed of from about 1 mm/sec to about 100 mm/sec.

5. A process according to claim 1 wherein a crystalline silicon composition is charged to the crucible; the silicon is heated to a temperature above its melting point in the crucible; the pendant drop formed at the lower edge of the capillary is contacted with a preheated substrate; the substrate is advanced at an angle of from 0° to 60° with the horizontal; and the coated substrate is removed at selected time intervals.

6. A process according to claim 5 wherein the deposition is carried out by charging doped silicon to the crucible, the quantity of doping varying with time so that the crystalline film of silicon varies in composition along the length of the substrate movement.

7. A process according to claim 5 wherein a plurality of crucibles are used to obtain side-by-side silicon coating having different compositions, wherein each crucible is charged with a silicon having different doping or a differently doped composition, the crucibles each having a capillary conduit of substantially equal length.

8. A process according to claim 1 wherein the substrate bears a seed crystal having a predetermined crystalline orientation and the pendant drop first contacts both the substrate and the seed crystal so that the deposited film has a preselected crystalline orientation.

9. A process according to claim 1 for continuously producing a multilayer thin film on the substrate, which process comprises charging the silicon material which will comprise each different layer to a separate crucible having a capillary conduit as described, with each axis being substantially vertical; bringing the material to its melting point in each crucible; moving the substrate into contact with the pendant drop formed at the bottom edge of the capillary conduit of the first crucible; advancing the thus coated substrate containing the first layer into contact with the pendant drop formed at the bottom edge of the capillary conduit in the second crucible; continuing the operation until the substrate is brought into contact with the capillary conduit of the last crucible; and removing the substrate coated with a plurality of superposed layers.

10. A process according to claim 1 wherein the layer or layers deposited on the substrate are from 10 microns to 1,000 microns thick.

* * * * *